(12) United States Patent
Suzuki

(10) Patent No.: US 10,115,644 B2
(45) Date of Patent: Oct. 30, 2018

(54) INTERPOSER MANUFACTURING METHOD

(71) Applicant: DISCO CORPORATION, Tokyo (JP)

(72) Inventor: Katsuhiko Suzuki, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/841,032

(22) Filed: Dec. 13, 2017

(65) Prior Publication Data

US 2018/0166355 A1 Jun. 14, 2018

(30) Foreign Application Priority Data

Dec. 14, 2016 (JP) ................... 2016-242235

(51) Int. Cl.
| | |
|---|---|
| *H01L 23/544* | (2006.01) |
| *H01L 23/15* | (2006.01) |
| *H01L 21/48* | (2006.01) |
| *H01L 23/498* | (2006.01) |
| *H05K 3/00* | (2006.01) |
| *H05K 1/03* | (2006.01) |

(52) U.S. Cl.
CPC ............ *H01L 23/15* (2013.01); *H01L 21/486* (2013.01); *H01L 23/49827* (2013.01); *H05K 1/0306* (2013.01); *H05K 3/0029* (2013.01); *H05K 3/0094* (2013.01); *H01L 2224/16225* (2013.01)

(58) Field of Classification Search
CPC ....... H01L 21/78; H01L 21/486; H01L 23/13; H01L 23/15; H01L 23/49827; H05K 1/0306

USPC .......................................................... 257/620
See application file for complete search history.

(56) References Cited

U.S. PATENT DOCUMENTS

| | | | | |
|---|---|---|---|---|
| 7,816,790 B2* | 10/2010 | Mizusawa | ............. | H01L 21/561 |
| | | | | 257/210 |
| 8,154,153 B2* | 4/2012 | Yang | ........................ | H04B 3/54 |
| | | | | 307/66 |
| 8,652,941 B2* | 2/2014 | Indyk | ...................... | H01L 24/29 |
| | | | | 438/113 |
| 9,418,908 B2* | 8/2016 | Tanaka | .................... | H01L 22/20 |

FOREIGN PATENT DOCUMENTS

| | | |
|---|---|---|
| JP | 2015-198212 | 11/2015 |
| WO | WO 01/01486 A1 | 1/2001 |

* cited by examiner

*Primary Examiner* — Luan C Thai
(74) *Attorney, Agent, or Firm* — Greer Burns & Crain Ltd.

(57) ABSTRACT

A plurality of interposers are made from a material substrate. The material substrate includes a glass substrate partitioned by a plurality of crossing division lines to define a plurality of separate regions. A multilayer member is provided on a first surface or a second surface opposite to the first surface of the glass substrate and has an insulating layer and a wiring layer. An exposed surface of the multilayer member is cut along each division line by using a first cutting blade to form a cut groove on the exposed surface of the multilayer member, the cut groove having a depth not reaching the glass substrate. The glass substrate is cut along each cut groove by using a second cutting blade having a thickness smaller than the width of each cut groove to thereby divide the glass substrate and manufacture the plural interposers.

3 Claims, 4 Drawing Sheets

INTERPOSER MANUFACTURING METHOD

BACKGROUND OF THE INVENTION

Field of the Invention

The present invention relates to a manufacturing method for an interposer using a glass substrate.

Description of the Related Art

To realize a smaller size and higher packaging density of semiconductor devices, there has been put into practical use a 3-dimensional packaging technique of stacking a plurality of semiconductor chips in their thickness direction and connecting them through a plurality of through electrodes (TSV: Through Silicon Via). In this 3-dimensional packaging technique, however, stacking of the plural semiconductor chips in their thickness direction causes a reduction in heat dissipation and also causes a problem such that semiconductor chips having different sizes cannot be used. Further, forming of the through electrodes extending through the semiconductor chips causes an increase in manufacturing cost.

In recent years, there has also been proposed another packaging technique of packaging a plurality of semiconductor chips through an interposer (intermediate substrate) formed by using a silicon wafer (see JP-T-2003-503855, for example). This packaging technique is also called a 2.5-dimensional packaging technique, in which a semiconductor chip having a memory function and a semiconductor chip having an arithmetic function are connected to an interposer so as not to be stacked. In this 2.5-dimensional packaging technique, at least a part of the semiconductor chips is not stacked in their thickness direction, so that the above various problems of the 3-dimensional packaging technique can be easily solved.

However, the interposer formed by using a silicon wafer has a problem such that the loss at a high frequency region is high and the price is also high. To cope with this problem, there has been proposed a technique of using a glass substrate for an interposer, where the glass substrate is useful for a reduction in loss at a high frequency region and also low in price (see Japanese Patent Laid-open No. 2015-198212, for example). This interposer is obtained by first forming a multilayer member on at least one principal surface of the glass substrate, the multilayer member including an insulating layer and a wiring layer, and next dividing the glass substrate along division lines previously set.

SUMMARY OF THE INVENTION

Division of the glass substrate is usually effected by rotating a cutting blade to cut the glass substrate along each division line. However, the interposer manufactured by this method using the cutting blade has a problem in heat resistance. Specifically, the result of a temperature cycling test (TCT) conducted to this interposer depicts that cracks were produced in the glass substrate and the multilayer member was separated from the glass substrate, causing an increase in fraction defective.

It is therefore an object of the present invention to provide an interposer manufacturing method which can improve the heat resistance of an interposer using a glass substrate.

In accordance with an aspect of the present invention, there is provided an interposer manufacturing method for manufacturing a plurality of interposers from a material substrate including a glass substrate having a first surface and a second surface opposite to the first surface and a multilayer member provided on the first surface or the second surface of the glass substrate, the glass substrate being partitioned by a plurality of crossing division lines to define a plurality of separate regions, the multilayer member including an insulating layer and a wiring layer, the interposer manufacturing method including a cut groove forming step of cutting an exposed surface of the multilayer member along each division line by using a first cutting blade to thereby form a cut groove on the exposed surface of the multilayer member, the cut groove having a depth not reaching the glass substrate; and a dividing step of cutting the glass substrate along each cut groove by using a second cutting blade having a thickness smaller than the width of each cut groove to thereby divide the glass substrate and manufacture the plurality of interposers.

Preferably, the grain size of abrasive grains contained in the second cutting blade is smaller than that of abrasive grains contained in the first cutting blade.

In accordance with another aspect of the present invention, there is provided an interposer manufacturing method for manufacturing a plurality of interposers from a material substrate including a glass substrate having a first surface and a second surface opposite to the first surface and a multilayer member provided on the first surface or the second surface of the glass substrate, the glass substrate being partitioned by a plurality of crossing division lines to define a plurality of separate regions, the multilayer member including an insulating layer and a wiring layer, the interposer manufacturing method including a laser processed groove forming step of applying a laser beam having an absorption wavelength to the multilayer member, to an exposed surface of the multilayer member along each division line to thereby form a laser processed groove on the exposed surface of the multilayer member, the laser processed groove having a depth not reaching the glass substrate; and a dividing step of cutting the glass substrate along each laser processed groove by using a cutting blade having a thickness smaller than the width of each laser processed groove to thereby divide the glass substrate and manufacture the plurality of interposers.

According to the interposer manufacturing method of the present invention, the groove (cut groove or laser processed groove) having a depth not reaching the glass substrate is first formed on the multilayer member along each division line, and the glass substrate is next cut along each groove by using the cutting blade having a thickness smaller than the width of each groove. Accordingly, a thin portion of the multilayer member is left at an end portion (peripheral portion) of each interposer manufactured. In the case of a conventional interposer, the multilayer member has a thick end portion, so that when the conventional interposer is heated, a large force due to a difference in coefficient of thermal expansion between the multilayer member and the glass substrate may be applied to the end portion of the interposer, causing easy separation of the multilayer member from the glass substrate. To the contrary, the multilayer member of the interposer manufactured by the present invention has a thin end portion (thin peripheral portion). Accordingly, as compared with the conventional interposer, the interposer manufactured by the present invention can reduce the possibility that a large force separating the multilayer member may be applied to the end portion of the interposer. That is, even when the interposer manufactured by the present invention is heated, the multilayer member is resistant to separation from the glass substrate. Thus, the heat resistance of the interposer using the glass substrate can be improved according to the interposer manufacturing method of the present invention.

The above and other objects, features and advantages of the present invention and, the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. The interposer manufacturing method according to this preferred embodiment is a method of manufacturing a plurality of interposers from a material substrate including a glass substrate and a multilayer member. This method includes a cut groove forming step (see FIGS. 2A and 2B) and a dividing step (see FIG. 3A). In the cut groove forming step, an exposed surface of the multilayer member is cut by a cutting blade (first cutting blade) along a plurality of division lines set on the glass substrate, thereby forming a cut groove on the multilayer member along each division line, in which each cut groove has a depth not reaching the glass substrate (i.e., the depth of each cut groove is slightly less than the thickness of the multilayer member). In the dividing step, the glass substrate is cut along each cut groove by another cutting blade (second cutting blade) having a thickness smaller than the width of each cut groove, thereby dividing the glass substrate along each cut groove to manufacture the plural interposers. The interposer manufacturing method according to this preferred embodiment will now be described in more detail.

Figure 1A:
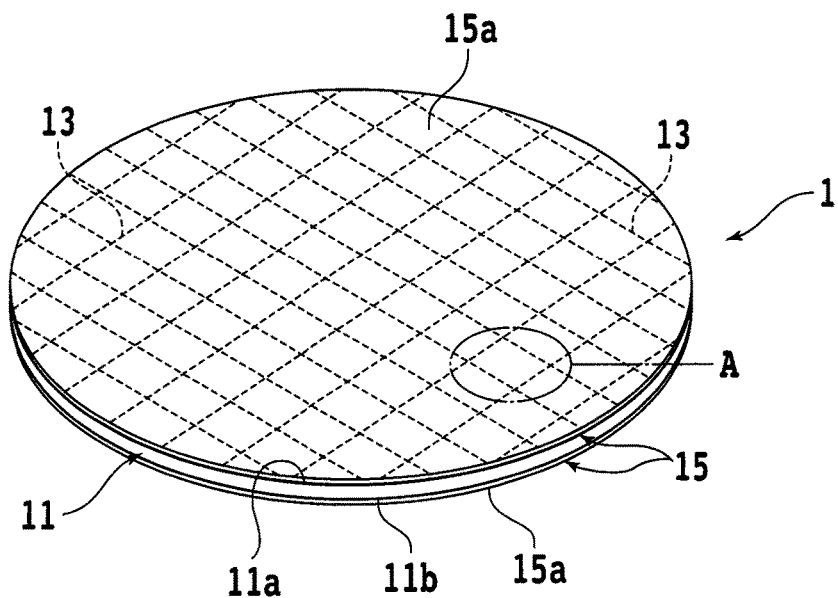
FIG. 1A is a schematic perspective view depicting the configuration of a material substrate to be used in a preferred embodiment of the present invention.
Figure 1B:
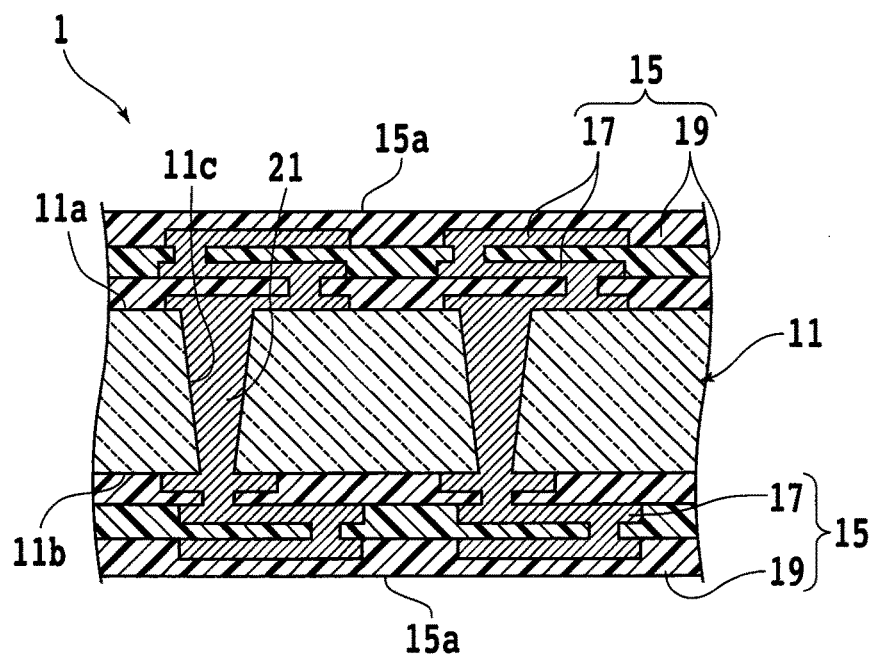
FIG. 1B is an enlarged sectional view of a part (circular area A depicted in FIG. 1A) of the material substrate depicted in FIG. 1A.

FIG. 1A is a schematic perspective view depicting the configuration of a material substrate 1 to be used in this preferred embodiment, and FIG. 1B is an enlarged sectional view of a part (circular area A depicted in FIG. 1A) of the material substrate 1 depicted in FIG. 1A. The material substrate 1 in this preferred embodiment includes a disk-shaped glass substrate 11. The glass substrate 11 is formed of soda lime glass, non-alkaline glass, or silica glass, for example. A plurality of crossing division lines (streets) 13 are set on the glass substrate 11 to thereby define a plurality of separate regions. The glass substrate 11 has a first surface (front side) 11a and a second surface (back side) 11b opposite to the first surface 11a. A multilayer member 15 composed of a plurality of stacked layers (films) is provided on each of the first surface 11a and the second surface 11b of the glass substrate 11. Each multilayer member 15 includes a plurality of wiring layers 17 formed from a conductor such as metal and a plurality of insulating layers 19 formed from an insulator such as resin. Any adjacent ones of the wiring layers 17 are insulated from each other by the insulating layer 19 interposed therebetween.

The glass substrate 11 is formed with a plurality of through holes 11c extending from the first surface 11a to the second surface 11b. Each through hole 11c is filled with an electrode 21 formed from a conductor such as metal. The wiring layers 17 on the first surface 11a and the wiring layers 17 on the second surface 11b are connected to each other through the electrodes 21. While the material substrate 1 has such a structure that the multilayer members 15 are provided on both the first surface 11a and the second surface 11b of the glass substrate 11 in this preferred embodiment, the multilayer member 15 may be provided on one of the first surface 11a and the second surface 11b of the glass substrate 11. In this case, the through holes 11c and the electrodes 21 may be omitted. Further, the configuration, forming method, etc. of the multilayer members 1 (the wiring layers 17 and the insulating layers 19), the through holes 11c, and the electrodes 21 are not especially limited. By dividing the material substrate 1 along the plural division lines 13, a plurality of interposers 3 (see FIG. 3B) can be manufactured.

Figure 2A:
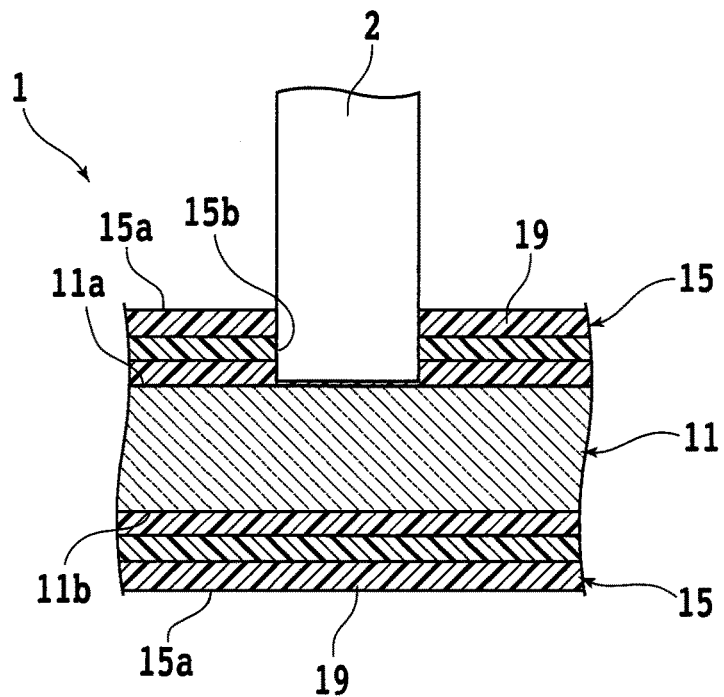
FIGS. 2A and 2B are partially sectional side views for illustrating a cut groove forming step in this preferred embodiment.
Figure 2B:
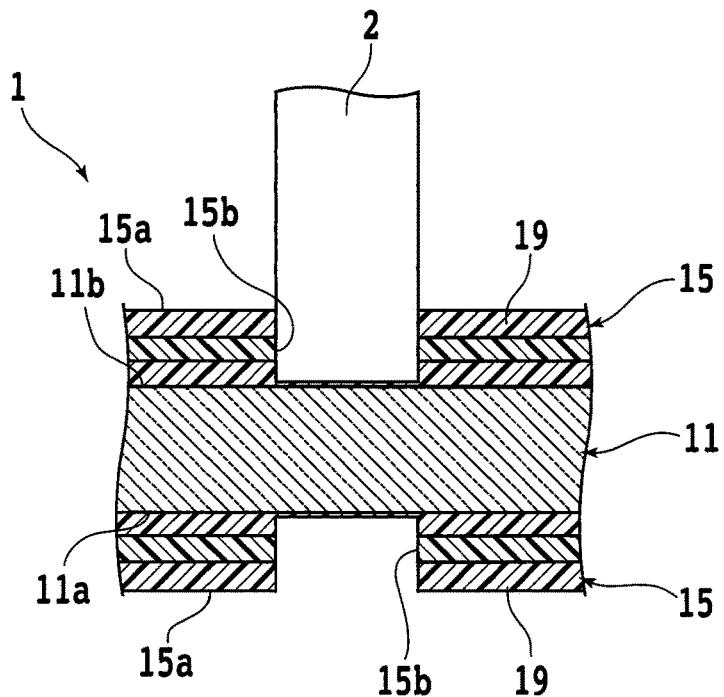

In the interposer manufacturing method according to this preferred embodiment, a cut groove forming step is first performed to cut an exposed surface of each multilayer member 15 along each division line 13 by using a first cutting blade, thereby forming a cut groove on each multilayer member 15 along each division line 13, where each cut groove has a depth not reaching the glass substrate 11. FIGS. 2A and 2B are partially sectional side views for illustrating the cut groove forming step. In this cut groove forming step, an annular cutting blade (first cutting blade) 2 is used to cut each multilayer member 15. The cutting blade 2 has a predetermined width (horizontal length, or thickness). The cutting blade 2 is formed by bonding abrasive grains of diamond or the like with a bond of resin, metal, or the like. The materials of the abrasive grains and the bond forming the cutting blade 2 may be suitably set according to the material of each multilayer member 15. Although the grain size of the abrasive grains contained in the cutting blade 2 is not especially limited, it may be set to approximately 20 µm to 40 µm, preferably, approximately 25 µm to 35 µm (typically, approximately 30 µm). Further, although the thickness of the cutting blade 2 is not especially limited, it may be set to approximately 150 µm to 500 µm, preferably, approximately 200 µm to 300 µm. The cutting blade 2 is mounted on one end portion of a spindle (not depicted), which is a rotating shaft substantially parallel to a horizontal direction. A rotational drive source (not depicted) such as a motor is connected to the other end of the spindle. Accordingly, the cutting blade 2 mounted on the spindle is rotated by a force transmitted from the rotational drive source.

In the cut groove forming step, the material substrate 1 is first held so that the first surface 11a of the glass substrate 11 is oriented upward. The holding of the material substrate 1 may be effected by using a chuck table (not depicted), for example. Thereafter, the relative position between the material substrate 1 and the cutting blade 2 is adjusted to align the cutting blade 2 with an extension line extending from any arbitrary target one of the division lines 13. Further, the lower end of the cutting blade 2 is set at a vertical position lower than an exposed surface 15a of the multilayer member 15 provided on the first surface 11a of the glass substrate 11 and higher than the first surface 11a of the glass substrate 11. Thereafter, the cutting blade 2 is rotated and the material substrate 1 and the cutting blade 2 are relatively moved in a direction parallel to the target division line 13.

Accordingly, as depicted in FIG. 2A, the exposed surface 15a of the multilayer member 15 provided on the first surface 11a of the glass substrate 11 is cut by the cutting blade 2 along the target division line 13, so that a cut groove 15b having a depth not reaching the glass substrate 11 can be formed on the multilayer member 15 provided on the first surface 11a of the glass substrate 11 along the target division line 13. The vertical position of the lower end of the cutting blade 2 is adjusted so that the distance from the bottom of the cut groove 15b to the first surface 11a of the glass substrate 11 becomes approximately 1 µm to 30 µm, preferably, approximately 2 µm to 20 µm. In other words, the multilayer member 15 provided on the first surface 11a of the glass substrate 11 is left along the target division line 13 so as to have a thickness of approximately 1 µm to 30 µm, preferably, approximately 2 µm to 20 µm. With this configuration, it is possible to suitably relax a force generating at an end portion of each interposer 3 due to heat, thereby preventing separation of the multilayer member 15.

After forming the cut groove 15b on the multilayer member 15 provided on the first surface 11a of the glass substrate 11 along the target division line 13, the above cutting operation is repeated along all of the other division lines 13 to thereby form a plurality of similar cut grooves 15b on the multilayer member 15 provided on the first surface 11a of the glass substrate 11 along all of the other division lines 13. Thereafter, the material substrate 1 is inverted to similarly perform the above cutting operation, thereby forming a plurality of similar cut grooves 15b on the multilayer member 15 provided on the second surface 11b of the glass substrate 11 along all the division lines 13 as depicted in FIG. 2B. After thus forming the cut grooves 15b on the multilayer member 15 provided on the second surface 11b of the glass substrate 11 along all the division lines 13, the cut groove forming step is finished. While the cut grooves 15b are first formed on the multilayer member 15 provided on the first surface 11a and next formed on the multilayer member 15 provided on the second surface 11b in this preferred embodiment, the cut grooves 15b may be first formed on the multilayer member 15 provided on the second surface 11b and next formed on the multilayer member 15 provided on the first surface 11a.

Figure 3A:
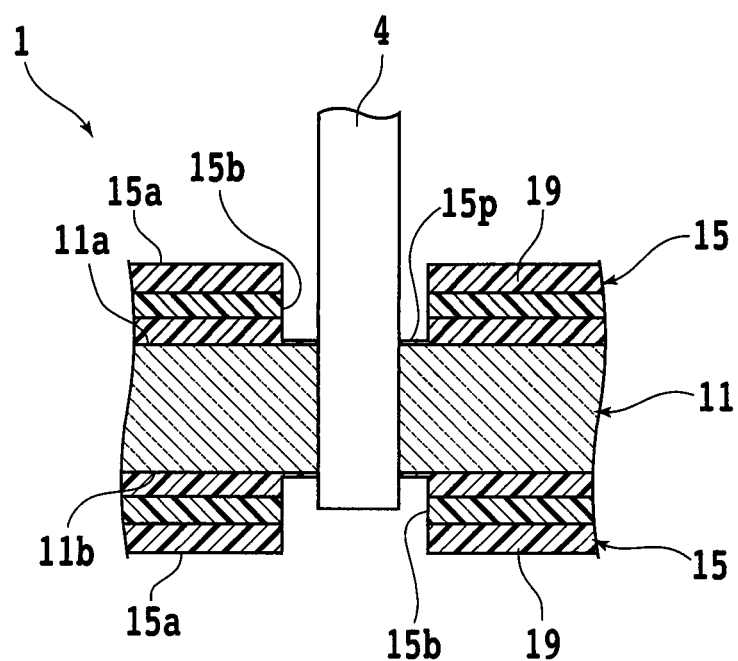
FIG. 3A is a partially sectional side view for illustrating a dividing step to be performed after the cut groove forming step.

After performing the cut groove forming step, a dividing step is performed to cut the glass substrate 11 along each cut groove 15b by using another cutting blade (second cutting blade) having a thickness smaller than the width of each cut groove 15b, thereby dividing the glass substrate 11 to manufacture a plurality of interposers 3. FIG. 3A is a partially sectional side view for illustrating the dividing step. In this dividing step, a cutting blade (second cutting blade) 4 having a thickness smaller than the width of each cut groove 15b is used to cut the glass substrate 11. The cutting blade 4 is formed by bonding abrasive grains of diamond or the like with a bond of resin, metal, or the like. The materials of the abrasive grains and the bond forming the cutting blade 4 may be suitably set according to the material of the glass substrate 11. Although the grain size of the abrasive grains contained in the cutting blade 4 is not especially limited, it may be set to approximately 5 µm to 20 µm, preferably, approximately 15 µm. The thickness of the cutting blade 4 must be set smaller than the width of each cut groove 15b (i.e., the thickness of the cutting blade 2). More specifically, the thickness of the cutting blade 4 is set to approximately 50 µm to 150 µm, preferably, approximately 75 µm to 125 µm (typically, approximately 100 µm). With this configuration, a thin portion 15p of the multilayer member 15 can be left at the end portion (peripheral portion) of each interposer 3 to be manufactured. This cutting blade 4 is also mounted on one end portion of a spindle (not depicted), which is a rotating shaft substantially parallel to a horizontal direction. A rotational drive source (not depicted) such as a motor is connected to the other end of the spindle. Accordingly, the cutting blade 4 mounted on the spindle is rotated by a force transmitted from this rotational drive source.

In the dividing step, the material substrate 1 is first held so that the first surface 11a of the glass substrate 11 is oriented upward. The holding of the material substrate 1 may be effected by using a chuck table (not depicted), for example. Thereafter, the relative position between the material substrate 1 and the cutting blade 4 is adjusted to align the cutting blade 4 with an extension line extending from any arbitrary target one of the cut grooves 15b (i.e., the division lines 13). Further, the lower end of the cutting blade 4 is set at a vertical position lower than the bottom of each cut groove 15b formed on the multilayer member 15 provided on the second surface 11b of the glass substrate 11. Thereafter, the cutting blade 4 is rotated and the material substrate 1 and the cutting blade 4 are relatively moved in a direction parallel to the target cut groove 15b (i.e., the target division line 13).

Accordingly, as depicted in FIG. 3A, the glass substrate 11 is fully cut by the cutting blade 4 along the target cut groove 15b (the target division line 13), so that the glass substrate 11 can be divided along the target cut groove 15b (the target division line 13). After dividing the glass substrate 11 along the target cut groove 15b (the target division line 13), the above cutting operation is repeated to thereby divide the glass substrate 11 along all of the other cut grooves 15b (all of the other division lines 13). After thus dividing the glass substrate 11 along all the cut grooves 15b (all the division lines 13), a plurality of interposers 3 are obtained and the dividing step is finished. While the glass substrate 11 is cut by the cutting blade 4 in the condition where the first surface 11a of the glass substrate 11 is oriented upward in this preferred embodiment, the glass substrate 11 may be cut by the cutting blade 4 in the condition where the second surface 11b of the glass substrate 11 is oriented upward.

Figure 3B:
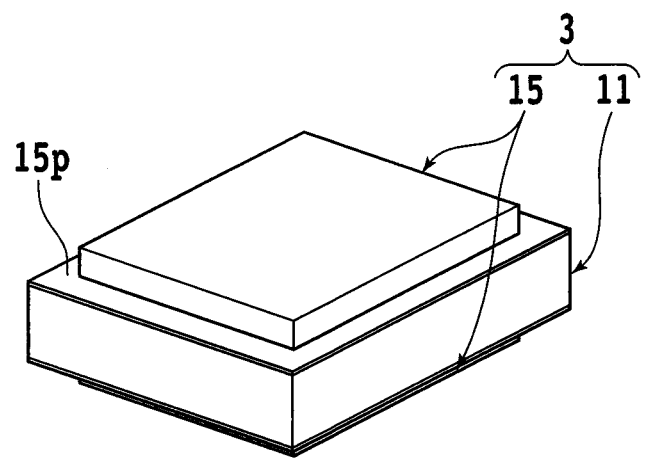
FIG. 3B is a schematic perspective view depicting the configuration of an interposer obtained by performing the dividing step.

FIG. 3B is a schematic perspective view depicting the configuration of each interposer 3 manufactured by this preferred embodiment. As depicted in FIG. 3B, the end portion (peripheral portion) of the interposer 3 has a thin portion 15p of each multilayer member 15. That is, the thickness of each multilayer member 15 is smaller at its peripheral portion than that at the other portion. With this configuration, it is possible to suppress a force (e.g., internal stress) generating at the end portion of the interposer 3 due to a difference in coefficient of thermal expansion between the glass substrate 11 and each multilayer member 15, thereby preventing separation of each multilayer member 15. In other words, the heat resistance of the interposer 3 can be improved.

In the interposer manufacturing method according to this preferred embodiment described above, the cut groove 15b is first formed on each multilayer member 15 along each division line (street) 13, where the cut groove 15b has a depth not reaching the glass substrate 11. Thereafter, the glass substrate 11 is fully cut along each cut groove 15b by using the cutting blade 4 having a thickness smaller than the width of each cut groove 15b. Accordingly, a thin portion 15p of each multilayer member 15 is left at the end portion (peripheral portion) of each interposer 3 manufactured. In the case of a conventional interposer, each multilayer member has a thick end portion, so that when the conventional interposer is heated, a large force due to a difference in coefficient of thermal expansion between each multilayer member and the glass substrate may be applied to the end portion of the interposer, causing easy separation of each multilayer member from the glass substrate. To the contrary, each multilayer member 15 of the interposer 3 manufactured by this preferred embodiment has a thin end portion 15p (thin peripheral portion). Accordingly, as compared with the conventional interposer, the interposer 3 manufactured by this preferred embodiment can reduce the possibility that a large force separating each multilayer member 15 may be applied to the end portion of the interposer 3. That is, even when the interposer 3 manufactured by this preferred embodiment is heated, each multilayer member 15 is resistant to separation from the glass substrate 11. Thus, the heat resistance of the interposer 3 using the glass substrate 11 can be improved according to the interposer manufacturing method of this preferred embodiment.

To confirm this heat resistance, a temperature cycling test (TCT) was conducted by using 30 samples for the interposer 3 according to this preferred embodiment and 30 samples for the conventional interposer having a thick end portion of each multilayer member, in which low-temperature treatment (at −55° C. for 15 minutes) and high-temperature treatment (at 125° C. for 15 minutes) as one cycle were repeated 500 times. As the result of this test, no separation of each multilayer member 15 was observed in all of the 30 samples for the interposer 3 according to this preferred embodiment. In contrast, separation of each multilayer member in the conventional interposer was observed in all of the 30 samples.

Figure 4A:
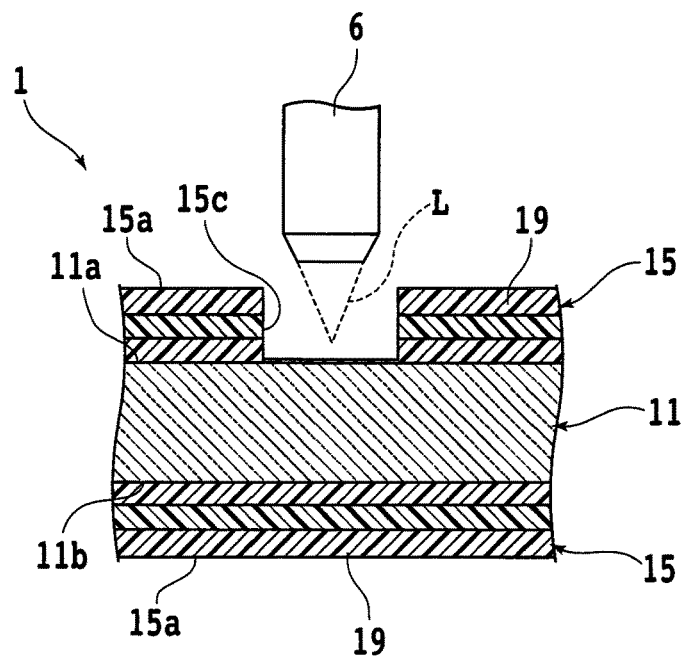
FIG. 4A is a partially sectional side view for illustrating a laser processed groove forming step as a modification of this preferred embodiment.

The present invention is not limited to the above preferred embodiment, but various modifications may be made. For example, the cut groove forming step of forming the cut grooves 15b may be replaced by a laser processed groove forming step of forming laser processed grooves by using a laser beam. FIG. 4A is a partially sectional side view for illustrating such a laser processed groove forming step as a modification of the above preferred embodiment. This laser processed groove forming step may be performed by using a laser applying unit 6 for applying a laser beam L suitable for the formation of laser processed grooves as depicted in FIG. 4A. The laser applying unit 6 includes a focusing lens (not depicted) for focusing and applying the laser beam L to a predetermined position. The laser beam L is oscillated from a laser oscillator (not depicted) and transmitted to the focusing lens. The laser oscillator is so configured as to oscillate a pulsed laser beam having an absorption wavelength to each multilayer member 15 (particularly, the insulating layers 19) (a wavelength region easily absorbable by each multilayer member 15).

In the laser processed groove forming step, the material substrate 1 is first held so that the first surface 11a of the glass substrate 11 is oriented upward. The holding of the material substrate 1 may be effected by using a chuck table (not depicted), for example. Thereafter, the relative position between the material substrate 1 and the laser applying unit 6 is adjusted to align the laser applying unit 6 with an extension line extending from any arbitrary target one of the division lines 13. Further, the laser beam L is applied from the laser applying unit 6 and at the same time the material substrate 1 and the laser applying unit 6 are relatively moved in a direction parallel to the target division line 13. Accordingly, as depicted in FIG. 4A, the laser beam L can be applied to the exposed surface 15a of the multilayer member 15 provided on the first surface 11a of the glass substrate 11 along the target division line 13, thereby ablating the multilayer member 15 provided on the first surface 11a to form a laser processed groove 15c on the exposed surface 15a. The laser processing conditions including the focal position of the laser beam L, the spot diameter of the laser beam L, and the power of the laser beam L are previously adjusted in such a range that the laser processed groove 15c having a depth not reaching the glass substrate 11 can be formed on the multilayer member 15 provided on the first surface 11a of the glass substrate 11. More specifically, the laser beam L is applied under the conditions that the multilayer member 15 provided on the first surface 11a of the glass substrate 11 is left along the target division line 13 so as to have a thickness of approximately 1 μm to 30 μm, preferably, approximately 2 μm to 20 μm. With this configuration, separation of the multilayer member 15 due to heat can be prevented.

After forming the laser processed groove 15c on the multilayer member 15 provided on the first surface 11a of the glass substrate 11 along the target division line 13, the above laser processing operation is repeated along all of the other division lines 13 to form a plurality of similar laser processed grooves 15c on the multilayer member 15 provided on the first surface 11a of the glass substrate 11 along all of the other division lines 13. Thereafter, the material substrate 1 is inverted to similarly perform the above laser processing operation, thereby forming a plurality of similar laser processed grooves 15c on the multilayer member 15 provided on the second surface 11b of the glass substrate 11. After thus forming the laser processed grooves 15c on the multilayer member 15 provided on the second surface 11b of the glass substrate 11 along all the division lines 13, the laser processed groove forming step is finished. While the laser processed grooves 15c are first formed on the multilayer member 15 provided on the first surface 11a and next formed on the multilayer member 15 provided on the second surface 11b in this modification, the laser processed grooves 15c may be first formed on the multilayer member 15 provided on the second surface 11b and next formed on the multilayer member 15 provided on the first surface 11a.

Figure 4B:
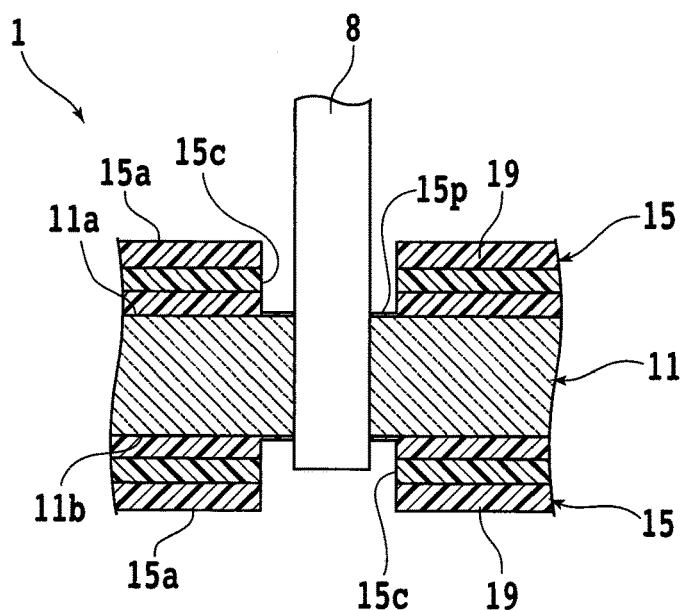
FIG. 4B is a partially sectional side view for illustrating a dividing step to be performed after the laser processed groove forming step.

After performing the laser processed groove forming step, a dividing step is performed to cut the glass substrate 11 along each laser processed groove 15c by using a cutting blade having a thickness smaller than the width of each laser processed groove 15c, thereby dividing the glass substrate 11 to manufacture a plurality of interposers 3. FIG. 4B is a partially sectional side view for illustrating the dividing step to be performed after the laser processed groove forming step. This dividing step is performed in a manner similar to that of the dividing step depicted in FIG. 3A. In the dividing step depicted in FIG. 4B, a cutting blade 8 having a thickness smaller than the width of each laser processed groove 15c is used to cut the glass substrate 11. The materials of the abrasive grains and the bond forming the cutting blade 8 may be suitably set according to the material of the glass substrate 11. The grain size of the abrasive grains forming the cutting blade 8 and the thickness of the cutting blade 8 are specified similarly to the cutting blade 4. After dividing the glass substrate 11 along all the laser processed grooves 15c (all the division lines 13), a plurality of interposers 3 are obtained and the dividing step is finished.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An interposer manufacturing method for manufacturing a plurality of interposers from a material substrate including a glass substrate having a first surface and a second surface opposite to said first surface and a multilayer member provided on said first surface or said second surface of said glass substrate, said glass substrate being partitioned by a plurality of crossing division lines to define a plurality of separate regions, said multilayer member including an insulating layer and a wiring layer, said interposer manufacturing method comprising:

a cut groove forming step of cutting an exposed surface of said multilayer member along each division line by using a first cutting blade to thereby form a cut groove on said exposed surface of said multilayer member, said cut groove having a depth not reaching said glass substrate; and a dividing step of cutting said glass substrate along each cut groove by using a second cutting blade having a thickness smaller than the width of each cut groove to thereby divide said glass substrate and manufacture said plurality of interposers.

2. The interposer manufacturing method according to claim 1, wherein the grain size of abrasive grains contained in said second cutting blade is smaller than that of abrasive grains contained in said first cutting blade.

3. An interposer manufacturing method for manufacturing a plurality of interposers from a material substrate including a glass substrate having a first surface and a second surface opposite to said first surface and a multilayer member provided on said first surface or said second surface of said glass substrate, said glass substrate being partitioned by a plurality of crossing division lines to define a plurality of separate regions, said multilayer member including an insulating layer and a wiring layer, said interposer manufacturing method comprising:

a laser processed groove forming step of applying a laser beam having an absorption wavelength to said multilayer member, to an exposed surface of said multilayer member along each division line to thereby form a laser processed groove on said exposed surface of said multilayer member, said laser processed groove having a depth not reaching said glass substrate; and a dividing step of cutting said glass substrate along each laser processed groove by using a cutting blade having a thickness smaller than the width of each laser processed groove to thereby divide said glass substrate and manufacture said plurality of interposers.

\* \* \* \* \*